United States Patent
Guo et al.

(10) Patent No.: US 11,997,894 B2
(45) Date of Patent: May 28, 2024

(54) DISPLAY PANEL AND DISPLAY DEVICE WITH REDUCED DISPERSION

(71) Applicant: Hubei Yangtze Industrial Innovation Center of Advanced Display Co., Ltd., Wuhan (CN)

(72) Inventors: Linshan Guo, Wuhan (CN); Xiang Cai, Wuhan (CN); Yong Yuan, Shanghai (CN); Yaqi Kuang, Shanghai (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 435 days.

(21) Appl. No.: 17/334,529

(22) Filed: May 28, 2021

(65) Prior Publication Data

US 2021/0288131 A1 Sep. 16, 2021

(30) Foreign Application Priority Data

Dec. 30, 2020 (CN) .......................... 202011606057.8

(51) Int. Cl.
*H01L 21/00* (2006.01)
*H10K 59/121* (2023.01)
*H10K 59/131* (2023.01)

(52) U.S. Cl.
CPC ......... *H10K 59/131* (2023.02); *H10K 59/121* (2023.02)

(58) Field of Classification Search
CPC .............................. H10K 59/131; H10K 59/121
See application file for complete search history.

(56) References Cited

U.S. PATENT DOCUMENTS

2019/0064552 A1 2/2019 Kim

FOREIGN PATENT DOCUMENTS

| CN | 109427854 A | 3/2019 |
| CN | 110047898 A | 7/2019 |
| CN | 111952342 A | 11/2020 |

OTHER PUBLICATIONS

Chinese Office Action dated Apr. 25, 2022, and English translation, for corresponding CN Application No. 202011606057.8.

*Primary Examiner* — Douglas M Menz
(74) *Attorney, Agent, or Firm* — TAROLLI, SUNDHEIM, COVELL & TUMMINO L.L.P.

(57) ABSTRACT

A display panel and a display device are provided. The display panel includes a substrate, signal lines located on the substrate, and a plurality of light-emitting elements each located on a side of one of the signal lines facing away from the substrate. Each light-emitting element includes a first electrode, a light-emitting layer, and a second electrode that are stacked sequentially. Each signal line includes at least one overlapping portion overlapping the light-emitting layer of one of the light-emitting elements in a direction perpendicular to the display panel. An angle θ between an extending direction of a part of the at least one overlapping portion and a pixel column direction in a display region that satisfies: 0°<θ<90°, or an angle θ between an extending direction of a tangent of a part of the at least one overlapping portion and a pixel column direction in a display area that satisfies: 0°<θ<90°.

20 Claims, 10 Drawing Sheets

DISPLAY PANEL AND DISPLAY DEVICE WITH REDUCED DISPERSION

CROSS-REFERENCE TO RELATED APPLICATIONS

The present application claims priority to Chinese Patent Application No. 202011606057.8, filed on Dec. 30, 2020, the content of which is incorporated herein by reference in its entirety.

TECHNICAL FIELD

The present disclosure relates to the field of display technology, and in particularly, to a display panel and a display device.

BACKGROUND

In the organic light-emitting display technology, an organic light-emitting diode is used as a light-emitting element, and the organic light-emitting diode includes an anode, a cathode, and an organic light-emitting layer disposed between the anode and the cathode. After voltages are applied to the anode and cathode of the organic light-emitting diode, respectively, the hole injected from the anode and the electron injected from the cathode are combined in the organic light-emitting layer to form the exciton. The formed exciton emits light while falling from the excited state to the ground state, thereby displaying an image.

Pixel circuits for driving the organic light-emitting diodes are commonly fabricated on a substrate, and then organic light-emitting diodes are respectively fabricated on the pixel circuits. A part of signal lines in the pixel circuit are located directly below the organic light-emitting diode. Since the signal line has a certain thickness and is not flat, the organic light-emitting diode is fabricated on an uneven surface, which causes the light generated in the organic light-emitting layer to be unevenly dispersed, thereby causing dispersion of the display panel and affects the display quality.

SUMMARY

In one aspect, an embodiment of the present disclosure provides a display panel, and the display panel includes a substrate, a plurality of signal lines located on the substrate, and a plurality of light-emitting elements each located on a side of one of the plurality of signal lines facing away from the substrate. Each of the plurality of light-emitting elements includes a first electrode, a light-emitting layer and a second electrode that are stacked in sequence. In a direction perpendicular to the display panel, each of the plurality of signal lines includes at least one overlapping portion that overlaps the light-emitting layer of one of the plurality of light-emitting elements. An angle θ is formed between an extending direction of a part of the at least one overlapping portion and a pixel column direction in a display region of the display panel that satisfies: 0°<θ<90°, or an angle θ is formed between an extending direction of a tangent of a part of the at least one overlapping portion and a pixel column direction in a display region of the display panel that satisfies: 0°<θ<90°.

In another aspect, an embodiment of the present disclosure provides a display device including the display panel described above.

BRIEF DESCRIPTION OF DRAWINGS

In order to more clearly illustrate the technical solutions in the embodiments of the present disclosure or the related art, the accompanying drawings used in the embodiments or the related art are briefly described below. The drawings described below are merely some embodiments of the present disclosure. Those of ordinary skill in the art can obtain other drawings based on these drawings.

DESCRIPTION OF EMBODIMENTS

To make objectives, technical solutions, and advantages of the embodiments of the present disclosure clearer, the technical solutions in the embodiments of the present disclosure will be described clearly and completely in conjunction with the drawings in the embodiments of the present disclosure. The embodiments described are a part of the embodiments of the present disclosure, but not all the embodiments. Based on the embodiments of the present disclosure, all other embodiments obtained by those of ordinary skill in the art without making creative efforts fall within the protection scope of the present disclosure.

The terms used in the embodiments of the present disclosure are merely for the purpose of describing exemplary embodiments and not intended to limit the present disclosure. Unless otherwise noted in the context, the singular form expressions "a", "an", "the" and "said" used in the embodiments and appended claims of the present disclosure are also intended to represent a plural form.

Figure 1:
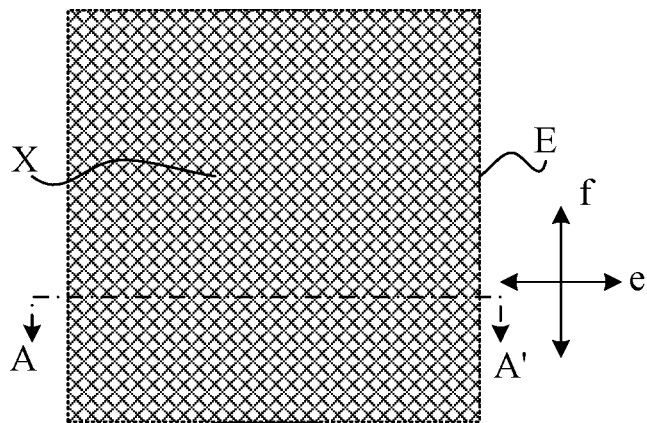
FIG. 1 is a top view of a part of a display panel in the related art.
Figure 2:
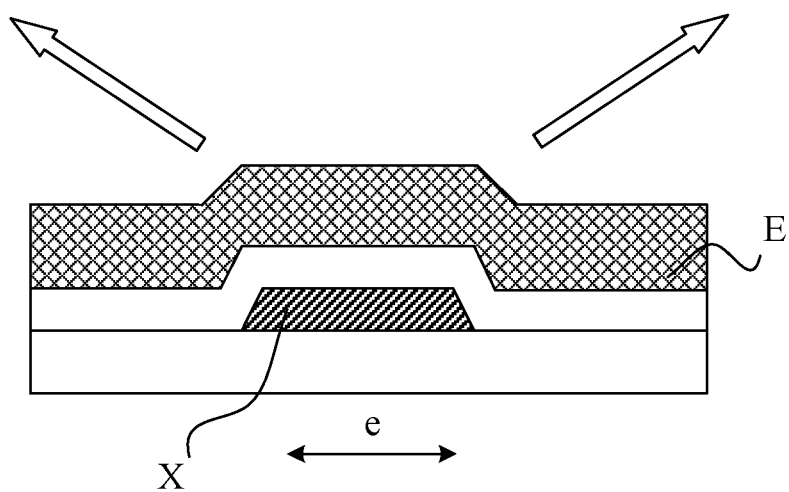
FIG. 2 is a simplified schematic diagram of a cross section along line A-A' shown in FIG. 1.

FIG. 1 is a top view of a part of a display panel in the related art, and FIG. 2 is a simplified schematic diagram of a cross section along line A-A' shown in FIG. 1. FIG. 1 illustrates a light-emitting element E in a display area and a signal line X overlapping with the light-emitting element E. An extending direction of the signal line X is the same as an extending direction f of an edge of the display panel (e.g., a long side of the display panel having a rectangular shape). When the user watches the display panel in a front view, the display panel is regarded as a plane, the extending direction f can be regarded as the upward and downward directions of the plane of the display panel, and a direction e can be regarded as the left and right directions of the plane of the display panel. As shown in FIG. 2, since the signal line X has a certain thickness, the surface of the layer formed on the signal line X is not flat, that is, has certain undulations. Therefore, the corresponding light-emitting element E formed on the surface also has certain fluctuations, which causes the light emitted by the light-emitting element E to be scattered. The arrows in the figure indicates the scattering directions of the light. When the user uses the display panel, the scattered light from the light-emitting element E in the left and right directions is easily caught by human eyes, which will seriously affect the display effect of the display panel.

Regarding the problems in the related art, embodiments of the present disclosure provide a display panel, the shape of the overlapping portion that overlaps the light-emitting layer of the light-emitting element in the direction perpendicular to the display panel is configured to reduce the probability of the scattered light caught by the user's eyes, weaken influence of the scattered light of the light-emitting element on the display effect, weaken the dispersion of the display panel, and improve the display quality.

Figure 3:
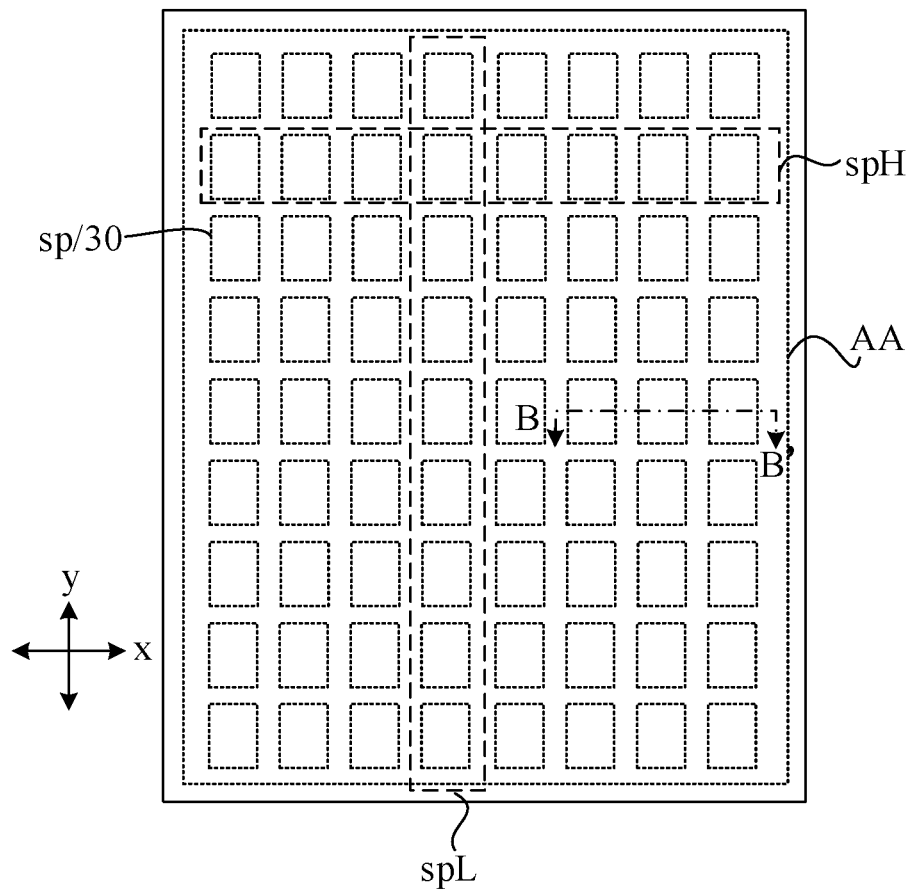
FIG. 3 is a top view of a display panel according to an embodiment of the present disclosure.

FIG. 3 is a top view of a display panel according to an embodiment of the present disclosure. As shown in FIG. 3, a plurality of subpixels sp is located in a display region AA of the display panel. One subpixel sp includes a light-emitting element 30. Multiple subpixels sp are arranged along a pixel row direction x to form a pixel row spH, multiple subpixels sp are arranged along a pixel column direction y to form a pixel column spL, and the pixel row direction x and the pixel column direction y intersect each other. In an embodiment, the pixel row direction x and the pixel column direction y may be perpendicular to each other. FIG. 3 can also be understood as the display panel that the user watched in a front view when using the display panel. When the user watches the display panel in the front view, the pixel column direction x can be regarded as upward and downward directions of a plane of the display panel, and the pixel row direction x can be regarded as left and right directions of the plane of the display panel.

Figure 4:
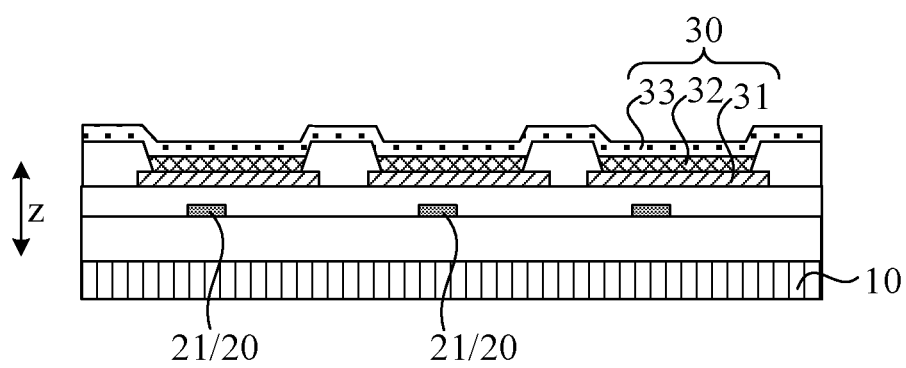
FIG. 4 is a simplified schematic diagram of a cross section along line B-B' shown in FIG. 3.

FIG. 4 is a simplified schematic diagram of a cross section along line B-B' shown in FIG. 3. As shown in FIG. 4, the display panel includes a substrate 10, a plurality of signal lines 20 located on the substrate 10, and a plurality of light-emitting elements 30. The light-emitting element 30 is located on a side of the signal line 20 facing away from the substrate 10. The light-emitting element 30 includes a first electrode 31, a light-emitting layer 32, and a second electrode 33 that are stacked in sequence. The signal line 20 includes an overlapping portion 21 overlapping the light emitting layer 32 in a direction z perpendicular to the display panel. FIG. 4 merely illustrates the relative positional relationship between the overlapping portion 21 of the signal line 20 and the light-emitting element 30, and does not illustrate that the light-emitting element 30 is formed on an uneven surface due to the overlapping portion 21 located below the light-emitting element 30 and thus does not illustrate the light-emitting element 30 that is manufactured to include the first electrode 31, the light-emitting layer 32 and the second electrode 33 so as to form undulating profile (i.e., uneven profile).

Figure 5:
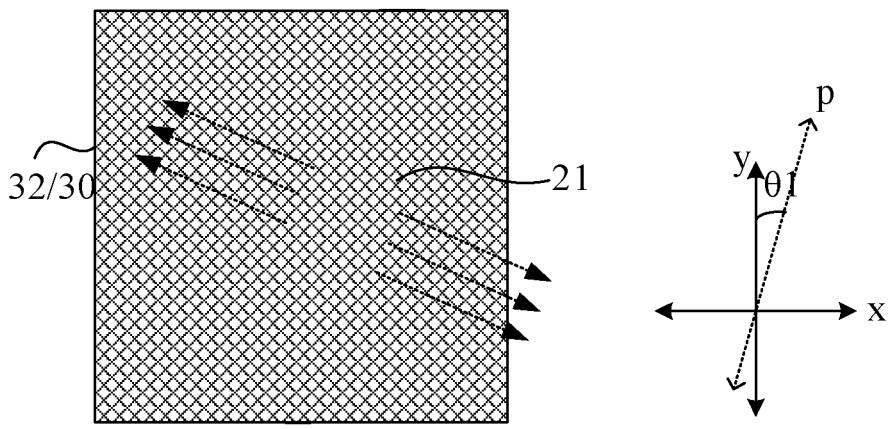
FIG. 5 is a top view of a part of a display panel according to an embodiment of the present disclosure.

In some embodiments, the overlapping portion 21 in a linear shape or polyline shape, and an angle θ is formed between an extending direction of a part of the overlapping portion 21 and the pixel column direction y in the display region AA that satisfies: 0°<θ<90°. When the pixel row direction x is perpendicular to the pixel column direction y, a sum of an acute angle between the extending direction of the part of the overlapping portion and the pixel column direction y and an acute angle between the extending direction of the overlapping portion and the pixel row direction x is 90°. FIG. 5 is a top view of a part of a display panel according to an embodiment of the present disclosure. FIG. 5 illustrates the overlapping portion 21 in a linear shape and the light-emitting layer 32 of the light-emitting element 30. An angle θ1 is formed between the extending direction p of the overlapping portion 21 and the pixel column direction y in the display region AA that satisfies: 0°<θ1<90°. Dotted arrows in FIG. 5 indicates a scattering direction of the light emitted by the light-emitting layer 32 due to the undulation of the light-emitting layer 32 caused by the overlapping portion 21. FIG. 5 is a schematic plan view of the display panel, and the dotted arrows in FIG. 5 can be regarded as an orthographic projection shape of the scattering direction of the light on the plane of the display panel. The dotted arrows are not parallel to the pixel column direction y and the pixel row direction x. When the user watches the display panel, the scattered light emitted by the light-emitting element 30 is less likely to be caught by the user's eyes, thereby weakening influence of the scattered light of the light-emitting element on the display effect, and improving the display quality.

Figure 6:
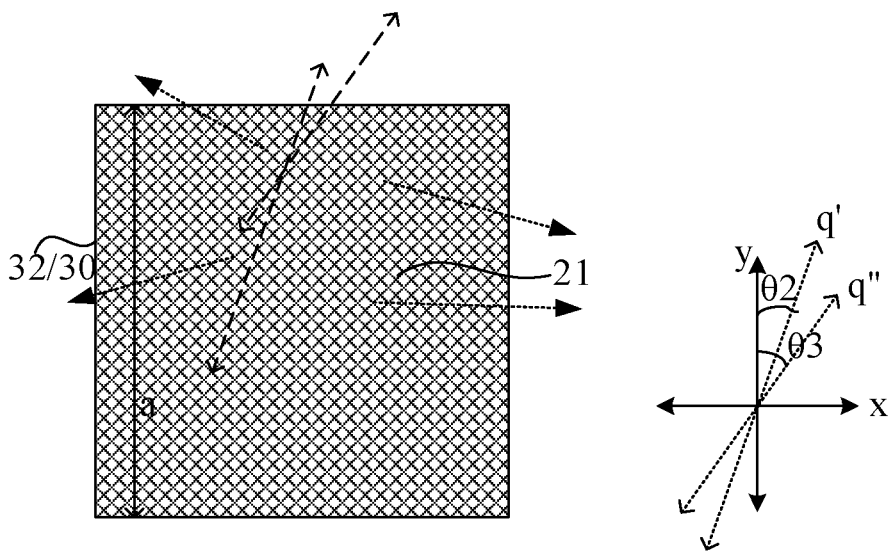
FIG. 6 is a top view of a part of a display panel according to an embodiment of the present disclosure.

In some embodiments, the overlapping portion 21 is in a curve shape, and an angle θ is formed between an extending direction of a tangent of a part of the overlapping portion and the pixel column direction y that satisfies: 0°<θ<90°. When the pixel row direction x is perpendicular to the pixel column direction y, a sum of an acute angle between the extending direction of the tangent and the pixel column direction y and an acute angle between the extending direction of the tangent and the pixel row direction x is 90°. FIG. 6 is a top view of a part of a display panel according to an embodiment of the present disclosure. As shown in FIG. 6, the overlapping portion 21 is in a C-curve shape, and an extending direction q' of a first tangent at a first position of the overlapping portion 21 and an extending direction q" of a second tangent at a second position of the overlapping portion 21 are shown in FIG. 6. An angle θ2 is formed between the extending direction q' of the first tangent and the pixel column direction y that satisfies: 0°<θ2<90°. An angle θ3 is formed between the extending direction q" of the second tangent and the pixel column direction y that satisfies: 0°<θ3<90°. Dotted arrows in FIG. 6 indicate scattering directions of the light emitted by the light-emitting layer 32 due to the undulation of the light-emitting layer 32 caused by the overlapping portion 21. FIG. 6 is also a schematic plan view of the display panel, and the dotted arrows in FIG. 6 is regarded as an orthographic projection shape of the scattering directions of the light on the plane of the display panel. In the embodiment, the scattering direction of at least part of the light is not parallel to the pixel column direction y and the pixel row direction x, and the scattered light is scattered in multiple directions. When the user watches the display panel in a front view, the scattered light is prevented from being concentrated in the left and right directions when the user faces the display panel in the front view, which reduces the probability that the scattered light emitted by the light-emitting element 30 is caught by the user's eyes, thereby weakening influence of the scattered light of the light-emitting element on the display effect and improving the display quality.

Figure 7:
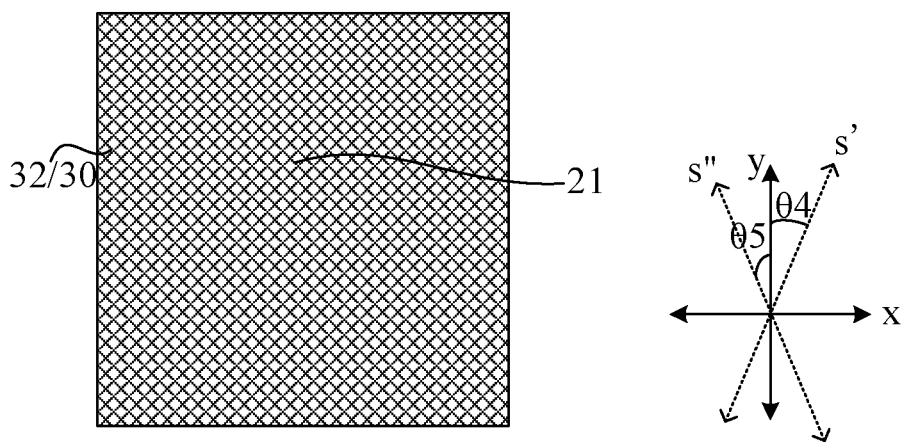
FIG. 7 is a top view of a part of a display panel according to an embodiment of the present disclosure.

FIG. 7 is a top view of a part of a display panel according to an embodiment of the present disclosure. In the embodiment, FIG. 7 illustrates the light-emitting layer 32 and the overlapping portion 21 overlapping the light-emitting layer 32, and the overlapping portion 21 is in a polyline shape including two line segments. An angle θ4 is formed between an extending direction s' of one of the two line segments and the pixel column direction y that satisfies 0°<θ4<90°. An angle θ5 is formed between an extending direction s" of the other one of the two line segments and the pixel column direction y that satisfies 0°<θ5<90°. FIG. 7 merely illustrates that the polyline shape includes two interconnected line segments. In another embodiment, the overlapping portion 21 is in a polyline shape including three or more line segments. In an embodiment, the overlapping portion 21 has a W-polyline shape. In the embodiments, the overlapping portion is configured to be in the polyline shape, such that the scattering directions of the light emitted by the light-emitting layer 32 are different due to the undulation of the light-emitting layer 32 caused by different line segments of the polyline shape, which prevents the scattered light from being concentrated in a constant direction. The directions of the line segments of the polyline shape are configured to reduce the probability of the scattered light emitted by the light-emitting element caught by the user's eyes, thereby weakening influence of the scattered light of the light-emitting element on the display effect and improving the display quality.

In an embodiment, the overlapping portion 21 has a linear shape or a polyline shape, where 45°≤θ<90°. That is, an acute angle between the extending direction of the overlapping portion and the pixel column direction y is greater than or equal to an acute angle between the extending direction of the overlapping portion and the pixel row direction x. In the application, the undulation of the light-emitting layer 32 above the overlapping portion 21 cause the scattered light emitted by the light-emitting layer 32 to be more likely to be emitted obliquely upward or downward, and when the user uses the display panel, an emitting direction of the scattered light is more likely to be directed towards the upward and downward directions than the left and right directions. In this way, the probability that the scattered light emitted by the light-emitting element is caught by the user's eyes is reduced, thereby weakening influence of the scattered light emitted by the light-emitting element on the display effect.

In some embodiments, the overlapping portion 21 is in a curve shape, and extending directions of tangents at different positions of the overlapping portion with the curve shape are not orientated in the same direction. The undulation of the light-emitting layer 32 above the overlapping portion 21 with the curve shape causes the light emitted by the light-emitting layer 32 to be scattered in multiple different directions, which can avoid that the scattered light is intensively emitted towards the left and right directions when the user is watching the display panel in the front view, thereby reducing the probability of the scattered light emitted by the light-emitting element 30 being caught by the user's eyes, weakening influence of the scattered light of the light-emitting element on the display effect, and improving the display quality.

In the embodiment as shown in FIG. 6, the overlapping portion 21 has a C-curve shape, a curvature of the C-curve shape is K, and the light-emitting layer 32 has a length of a μm in the pixel column direction, where $1 \times 10^4 \text{ m}^{-1} \leq K \leq (2/a) \times 10^6 \text{ m}^{-1}$. A reciprocal of the curvature is a radius of curvature according to the geometry principle. If $K \geq 1 \times 10^4 \text{ m}^{-1}$, a radius of curvature of the overlapping portion 21 is not greater than 100 μm and $K \leq (2/a) \times 10^6 \text{ m}^{-1}$, which can ensure that the radius of curvature of the overlapping portion 21 is not smaller than a/2 μm. In an embodiment, a pixel has a length of 20 μm, which can ensure that the overlapping portion 21 under the light-emitting layer 32 is in the curve shape.

Figure 8:
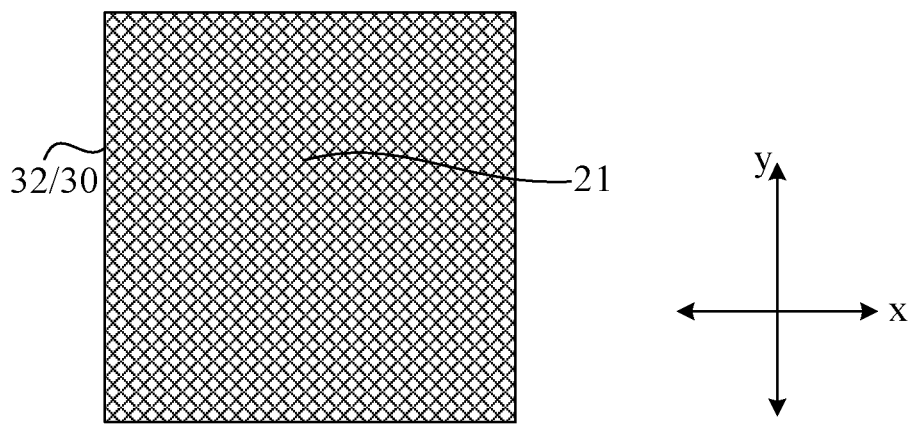
FIG. 8 is a top view of a part of a display panel according to an embodiment of the present disclosure.

FIG. 8 is a top view of a part of a display panel according to an embodiment of the present disclosure. In the embodiment shown in FIG. 8, the overlapping portion 21 is in an S-curve shape, and extending directions of tangents at different positions of the overlapping portion with the S-curve shape are not orientated in the same direction. Accordingly, the undulation of the light-emitting layer 32 above the overlapping portion 21 with the S-curve shape causes the light emitted by the light-emitting layer 32 to be scattered in multiple different directions In this way, the scattered light is prevented from being intensively emitted in the left and right directions of the display panel when the user watches the display panel in the front view, which reduces the probability of the scattered light emitted by the light emitting element 30 being caught by the user's eyes. The overlapping portion 21 with the S-curve shape may be regarded as a combination of two overlapping portions 21, each of which has a C-curve shape. In an embodiment, the two C-curve shape combined into the S-curve shape have the same radius of curvature. In another embodiment, the two C-curve shape combined into the S-curve shape have different radii of curvature.

Figure 9:
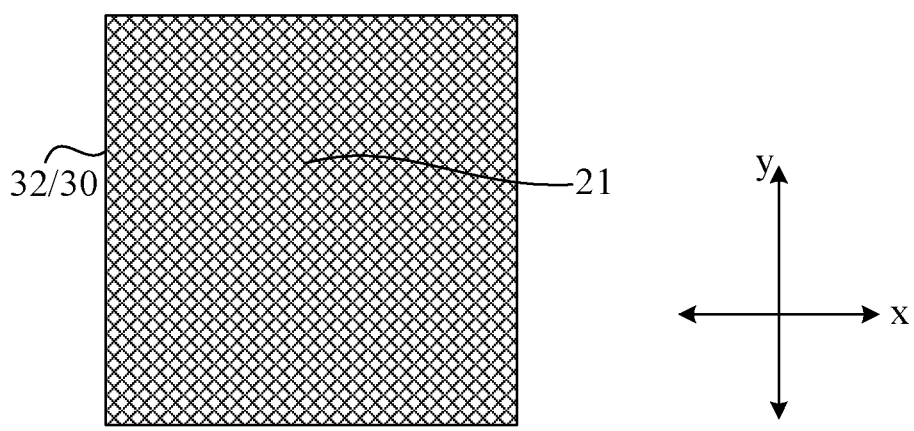
FIG. 9 is a top view of a part of a display panel according to an embodiment of the present disclosure.

FIG. 9 is a top view of a part of a display panel according to an embodiment of the present disclosure. In the embodiment shown in FIG. 9, the overlapping portion 21 is in a combined curve shape, and FIG. 9 schematically illustrates that the shape of the overlapping portion is similar to a combination of S-curve shape and C-curve shape that are connected to each other. The combined curve shape may be a combined shape of at least two connected S-shaped curves, a combined shape of at least two connected C-shaped curves, or a combined shape of an S-shaped curve and a C-shaped curve that are connected to each other. The combined curve shape may be a wave-curve sh. The embodiments increase the variation of the extending direction of the overlapping portion with the linear shape, and accordingly can increase the dispersion directions of the scattered light emitted by the light-emitting layer located above the overlapping portion. This can avoid the scattered light to be intensively emitted in the left and right directions when the user watches the display panel in the front view, thereby reducing the probability that the scattered light emitted by the light-emitting element is caught by the user's eyes.

Figure 10:
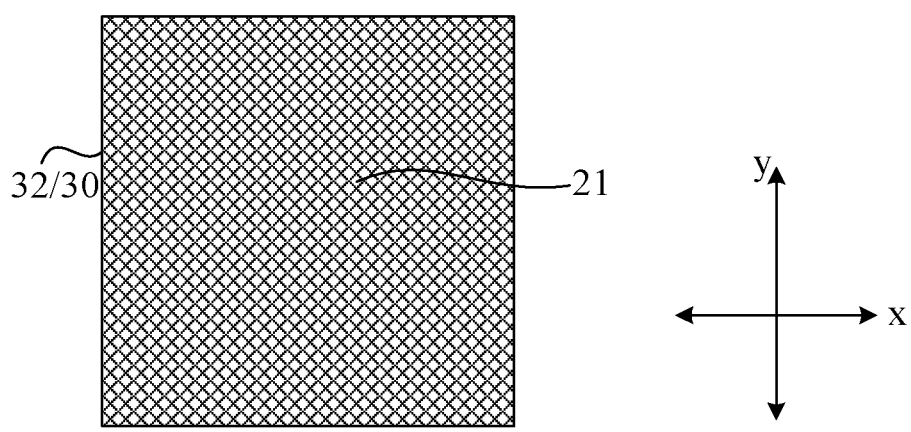
FIG. 10 is a top view of a part of a display panel according to an embodiment of the present disclosure.

In an embodiment, the overlapping portion 21 is in an S-curve shape. FIG. 10 is a top view of a part of a display panel according to an embodiment of the present disclosure. As shown in FIG. 10, the overlapping portion 21 with the S-curve shape is arranged obliquely with respect to the pixel column direction y. That is, in the embodiment where the overlapping portion 21 has the curve shape, the overlapping portion with the curve shape can be arranged obliquely with respect to the pixel column direction y. In the embodiment where the overlapping portion 21 has the polyline shape, the overlapping portion with the polyline shape can be arranged obliquely with respect to the pixel column direction y.

The above embodiments of FIG. 5 to FIG. 10 illustrate the overlapping portion 21 that has a substantially same width at all positions in the extending direction of the overlapping portion 21. In some embodiments, in a plane of the substrate, an orthographic projection of the overlapping portion on the substrate has at least a first width and a second width along the extending direction of the overlapping portion, and the first width is not equal to the second width. In other words, the widths of the overlapping portion at different positions are not the same. In this way, the dispersion directions of the scattered light emitted by the light-emitting layer located above the overlapping portion can be increased, the scattered light is prevented from being intensively emitted in the left and right directions when the user watches the display panel in the front view, and the probability that the scattered light emitted by the light-emitting element is caught by the user's eyes is reduced.

Figure 11:
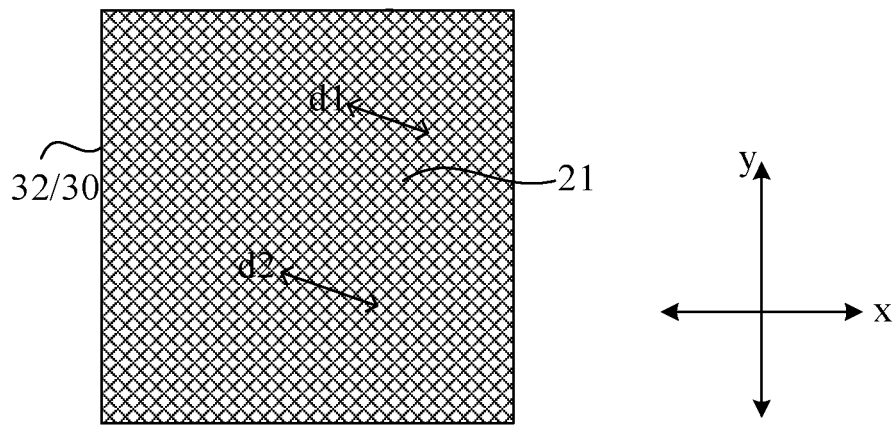
FIG. 11 is a top view of a part of a display panel according to an embodiment of the present disclosure.

In an example shown in FIG. 5 where the overlapping portion has the linear shape, and FIG. 11 is a top view of a display panel according to an embodiment of the present disclosure. FIG. 11 is a top view diagram, in which a plane of the paper can be regarded as the plane of the substrate. When viewing in the top view, the overlapping portion 21 overlaps its orthographic projection on the substrate, and FIG. 11 therefore does not illustrate the orthographic projection of the overlapping portion 21 on the substrate. In the extending direction of the overlapping portion 21, the orthographic projection of the overlapping portion 21 on the substrate has at least a first width d1 and a second width d2, and the first width d1 is not equal to the second width d2.

Figure 12:
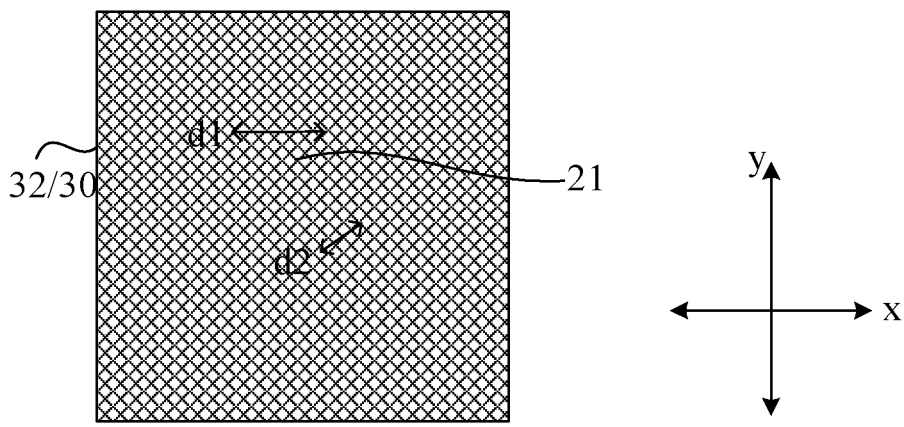
FIG. 12 is a top view of a part of a display panel according to an embodiment of the present disclosure.

In an example, the overlapping portion has an S-shape, and FIG. 12 is a top view of a part of a display panel according to an embodiment of the present invention. In an embodiment shown in FIG. 12, an orthogonal projection of the overlapping portion 21 on the substrate has at least a first width d1 and a second width d2 in the extending direction of the overlapping portion 21, and the first width d1 is not equal to the second width d2.

In the display panel according to an embodiment of the present disclosure, the overlapping portion overlapping the light-emitting layer may be configured to have any one of a linear shape, a polyline shape or a curve shape. In an embodiment, the overlapping portion has a linear shape, and the angle between the extending direction of the overlapping portion and the pixel column direction is configured to be within a range. In an embodiment, the overlapping portion has a curve shape, and the angles between the extending directions of tangents at positions of a part of the overlapping portion and the pixel column direction is configured to be within a range. In an embodiment, the width of the overlapping portion at each position in the extending direction of the overlapping portion is substantially the same. In another embodiment, the widths of the overlapping portion at least two positions in the extending direction of the overlapping portion are different. In some embodiments, one light-emitting layer overlaps one overlapping portion, or one light-emitting layer overlaps an odd number of overlapping portions, e.g., three overlapping portions. In an embodiment, one light-emitting layer overlaps an even number of overlapping portions, for example, one light-emitting layer overlaps two or four overlapping portions. When one light-emitting layer overlaps at least two overlapping portions, the at least two overlapping portions overlapping the same light-emitting layer have a same shape or have different shapes in an embodiment. In the following, embodiments are provided to illustrate the arrangement of the overlapping portions in detail.

Figure 13:
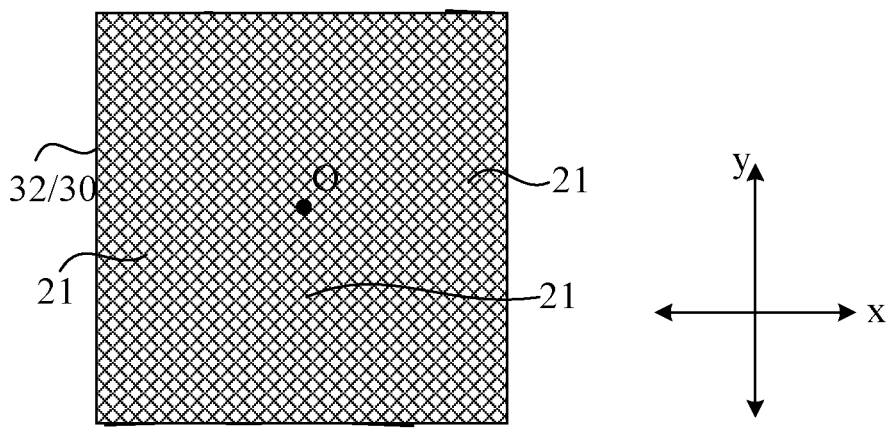
FIG. 13 is a top view of a part of a display panel according to an embodiment of the present disclosure.

In some embodiments, the light-emitting layer overlaps an odd number of overlapping portions. For example, FIG. 13 is a top view of a part of a display panel according to an embodiment of the present disclosure, and the top view direction of the display panel is parallel to the direction perpendicular to the display panel. As shown in FIG. 13, in the direction perpendicular to the display panel, the light-emitting layer 32 overlaps an odd number of overlapping portions 21 (e.g., three overlapping portions 21 shown in the figure), and one of the odd number of overlapping portions 21 overlaps a center O of the light-emitting layer 32. The overlapping portion 21 overlapping the center O enables the scattered light caused by the overlapping portion 21 to be evenly dispersed to both sides of the overlapping portion, so that the directivity of the scattered light of the light-emitting layer 32 can be relatively uniform and the scattered light is prevented from being concentrated in a constant direction and thus easily caught by the human eyes.

FIG. 13 merely illustrates the three overlapping portions 21, each of which has a linear shape. FIG. 13 illustrates that the light-emitting layer 32 is in a square shape, and the center O of the light-emitting layer 32 is a geometric center of the square shape. If the light-emitting layer 32 has a regular, the center of the light-emitting layer 32 is a geometric center of the regular shape. If the light-emitting layer 32 has an irregular shape, the center of the light-emitting layer 32 is a center of gravity of the irregular shape.

In some embodiments, the light-emitting layer overlaps an even number of overlapping portions in the direction perpendicular to the display panel. Each of the even number of overlapping portions has any one of a linear shape, a polyline shape or a curve shape. The even number of overlapping portions may have a same shape or different shapes. Combined with the configuration of the positions where the even number of overlapping portions overlap the light-emitting layer, at least one of the directions of the scattered light caused by the overlapping portions are note parallel to the pixel column direction y and the pixel row direction x, avoiding the scattered light to be intensively emitted in the left and right directions when the user is watching the display panel in the front view, and reducing the probability of the scattered light emitted by the light-emitting element being caught by the user's eyes.

Figure 14:
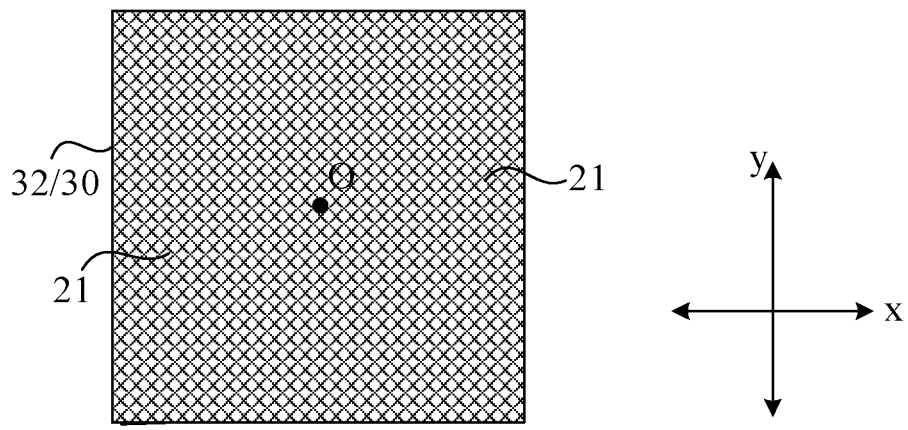
FIG. 14 is a top view of a part of a display panel according to an embodiment of the present disclosure.

FIG. 14 is a top view of a part of a display panel according to an embodiment of the present disclosure. In an embodiment, FIG. 14 merely illustrates the light-emitting layer 32 and the overlapping portion overlapping the light-emitting layer 32 in a simplified manner. In the direction perpendicular to the display panel, each of the even number of overlapping portions 21 does not overlap the center O of the light-emitting layer 32. FIG. 14 only exemplarily illustrates one light-emitting layer 32 overlapping two overlapping portions 21, and the two overlapping portions 21 have the same shape of a linear shape. In this embodiment, the positions where the overlapping portions overlap the light-emitting layer are all deviated from the center of the light-emitting layer, and each of the two overlapping portions overlaps an edge portion of the light-emitting layer. In this case, when the light-emitting emits light, the scatted light is emitted at the edge portions to reduce the scattered light at the center of the light-emitting element. In combination with the configuration of the shape of the overlapping portion, the scattering direction of at least part of the light emitted by the light-emitting element are not parallel to the pixel column direction and the pixel row direction. Accordingly, the scattered light is prevented from being concentrated in the left and right directions when the user watches the display panel in the front view, and the probability that the scattered light emitted by the light-emitting element is caught by the user's eyes is reduced, thereby weakening influence of the scattered light of the light-emitting element on the display effect.

In an embodiment, as shown in FIG. 14, orthographic projections of the even number of overlapping portions 21 on the substrate are respectively located on both sides of the center O of the orthographic projection of the light-emitting layer 32 on the substrate. In this way, the scattered light emitted by the light-emitting layer can be dispersed and emitted to both sides of the center of the light-emitting layer as much as possible, so that the directivity of the light scattered by the light-emitting layer can be relatively dispersed, and the scattered light can be prevented from being concentrated in a constant direction and easily caught by human eyes.

Figure 15:
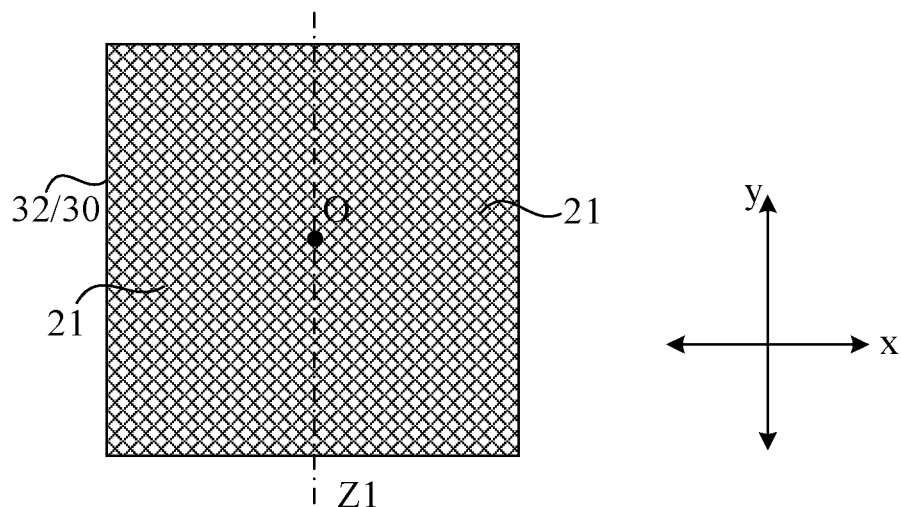
FIG. 15 is a top view of a part of a display panel according to an embodiment of the present disclosure.

FIG. 15 is a top view of a part of a display panel according to an embodiment of the present disclosure. In the embodiment shown in FIG. 15, orthographic projections of the even number of overlapping portions 21 on the substrate are axisymmetric with respect to a first axis of symmetry Z1, and the center O of the orthographic projection of the light-emitting layer 32 on the substrate is located on the first axis of symmetry Z1. The shape of the overlapping portion is illustrated as a C-curve shape in FIG. 15. In this embodiment, the scattered light emitted by the light-emitting layer can be uniformly emitted to both sides of the center of the light-emitting layer, the directivity of the scattered light of the light-emitting layer can be relatively uniform, and the scattering direction of at least part of the light is not parallel to the pixel column direction and the pixel row direction, which avoids that the scattered light is concentrated in a constant direction and easily caught by human eyes.

In FIG. 15, an extending direction of the first axis of symmetry Z1 is substantially parallel to the pixel column direction y. In another embodiment, the extending direction of the first axis of symmetry Z1 and the pixel column direction y form a certain acute angle.

Figure 16:
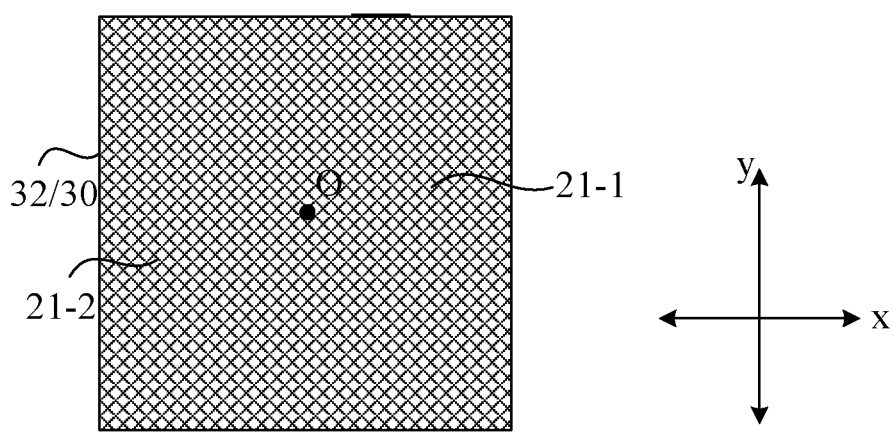
FIG. 16 is a top view of a part of a display panel according to an embodiment of the present disclosure.

In some embodiments, in the direction perpendicular to the display panel, the light-emitting layer overlaps N overlapping portions having different shapes, where N≥2 and N is an integer, for example, N=2. FIG. 16 is a top view of a part of a display panel according to an embodiment of the present disclosure. As shown in FIG. 16, in the direction perpendicular to the display panel, the light-emitting layer 32 overlaps both an overlapping portion 21-1 and an overlapping portion 21-2, the overlapping portion 21-1 is in a linear shape, and the overlapping portion 21-2 is in a curve shape. Since the shapes of the overlapping portions overlapping the same light-emitting layer are different, the different overlapping portions cause different emitting directions of the scattered light emitted by the light-emitting layer, which can make the scattering directions of the scattered light emitted by the light-emitting layer more dispersed, and the scattering direction of a part of the light is not parallel to the pixel column direction and the pixel row direction, thereby preventing the scattered light from being concentrated in a constant direction and easily caught by human eyes.

In some embodiments, the plurality of light-emitting elements includes a first light-emitting element and a second light-emitting element that are adjacent to each other, the first light-emitting element includes a first light-emitting layer, and the second light-emitting element includes a second light-emitting layer. A first overlapping portion overlapping the first light-emitting layer has a shape different from a shape of a second overlapping portion overlapping the second light-emitting layer, so that scattering regularity of the scattered light emitted by the first light-emitting layer is different from scattering regularity of the scattered light emitted by the second light-emitting layer, and thus periodic dispersion caused by the same scattering regularity of scattered light emitted by adjacent light-emitting elements can be avoided.

Related parameters of the overlapping portion overlapping the light-emitting layer may include a shape of the overlapping portion, a width of the overlapping portion, and a number of overlapping portions overlapping the same light-emitting layer. The above three related parameters can be combined arbitrarily to realize that the overlapping portions respectively overlapping two adjacent light-emitting layers have different shapes. The above "different shapes" can be understood as follows.

When each light-emitting layer overlaps one overlapping portion, the shape of the first overlapping portion overlapping the first light-emitting layer can be different from the shape of the second overlapping portion overlapping the second light-emitting layer. For example, the first overlapping portion overlapping the first light-emitting layer has a linear shape, and the second overlapping portion overlapping the second light-emitting layer has a curve shape. In another embodiment, the first overlapping portion overlapping the first light-emitting layer and the second overlapping portion overlapping the second light-emitting layer each have a linear shape and an angle between the extending direction of the first overlapping portion and the pixel column direction is different from an angle between the extending direction of the second overlapping portion and the pixel column direction. In an embodiment, the first overlapping portion and the second overlapping portion have two different curve shapes. In an embodiment, two overlapping portions respectively overlapping two adjacent light-emitting elements have the same linear shape, but the two overlapping portions have different line widths.

The number of first overlapping portions overlapping the first light-emitting layer is different from the number of the second overlapping portions overlapping the second light-emitting layer, so as to realize that an overall shape of the first overlapping portion and an overall shape of the second overlapping portion are different from each other. When the light-emitting layer overlaps at least two overlapping portions, the overlapping portions overlapping the same light-emitting layer can have different shapes and/or different widths.

Figure 17:
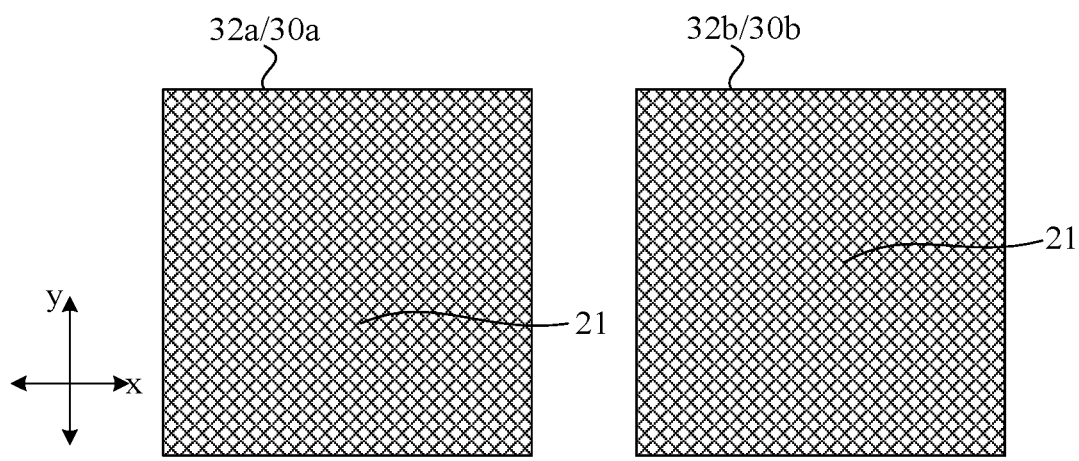
FIG. 17 is a top view of a part of a display panel according to an embodiment of the present disclosure.

In an embodiment, the overlapping portions respectively overlapping light-emitting layers of two adjacent light-emitting elements have different linear shapes. In an embodiment, the shape of the overlapping portion overlapping one of the light-emitting layers is a linear shape, and the shape of the overlapping portion overlapping another one of the light-emitting layers is a curve shape. FIG. 17 is a top view of a part of a display panel according to an embodiment of the present disclosure. As shown in FIG. 17, a plurality of light-emitting elements includes a first light-emitting element 30a and a second light-emitting element 30b, the first light-emitting element 30a includes a first light-emitting layer 32a, and the second light-emitting element 30b includes a second light-emitting layer 32b. A first overlapping portion 21 overlapping the first light-emitting layer 32a and a second overlapping portion 21 overlapping the second light-emitting layer 32b have different shapes. The first overlapping portion 21 overlapping the first light-emitting layer 32a is in a curve shape, and the second overlapping portion 21 overlapping the second light-emitting layer 32b is in a linear shape.

Figure 18:
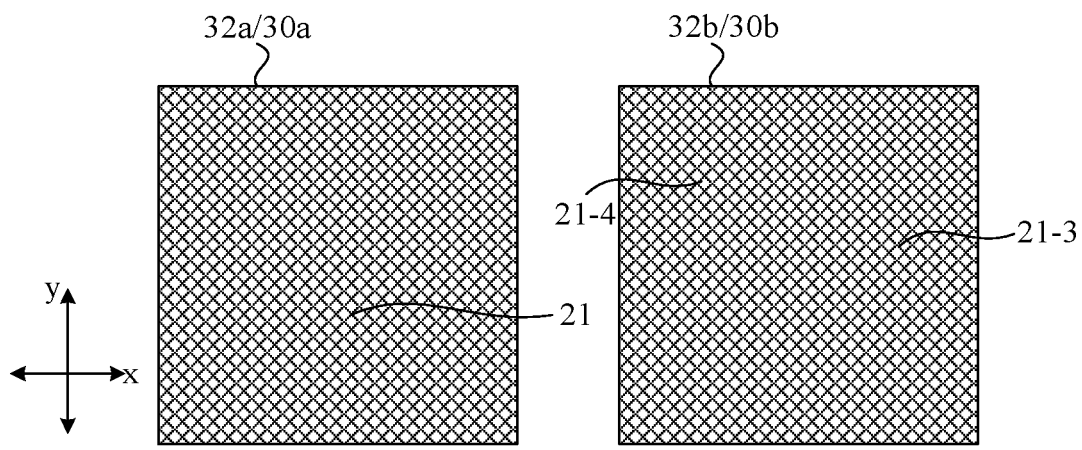
FIG. 18 is a top view of a part of a display panel according to an embodiment of the present disclosure.

In an embodiment, the number of at least one overlapping portion overlapping the light-emitting layer of a first light-emitting element is different from the number of overlapping portions overlapping the light-emitting layer of a second light-emitting element adjacent to the first light-emitting element. FIG. 18 is a top view of a part of a display panel according to an embodiment of the present disclosure. As shown in FIG. 18, the first light-emitting element 30a and the second light-emitting element 30b are adjacent to each other, the first light-emitting element 30a includes a first light-emitting layer 32a, and the second light-emitting element 30b includes a second light-emitting layer 32b. The first light-emitting layer 32a overlaps an overlapping portion 21 with a curve shape, the second light-emitting layer 32b overlaps both an overlap portion 21-3 and an overlap portion 21-4, the overlapping portion 21-3 has a polyline shape, and the overlapping portion 21-4 has a linear shape.

Figure 19:
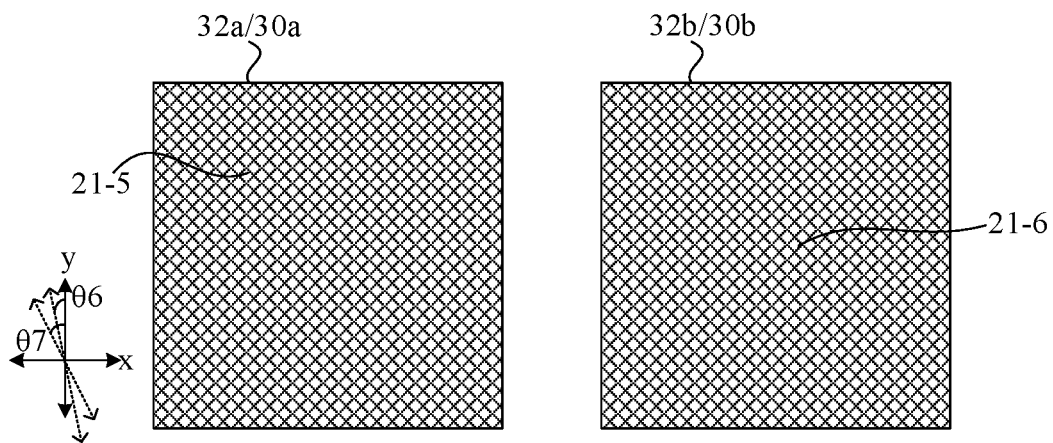
FIG. 19 is a top view of a part of a display panel according to an embodiment of the present disclosure.

In an embodiment, angles between the overlapping portions and the pixel column direction are configured in a manner that the shapes of the overlapping portions overlapping the light-emitting layers of two adjacent light-emitting elements are different. FIG. 19 is a top view of a part of a display panel according to an embodiment of the present disclosure. As shown in FIG. 19, an overlapping portion 21-5 overlapping the first light-emitting layer 32a and an overlapping portion 21-6 overlapping the second light-emitting layer 32b each have a linear shape, an angle between the overlapping portion 21-5 and the pixel column direction y is $\theta 7$, and an angle between the overlapping portion 21-6 and the pixel column direction y is $\theta 6$, where $\theta 7 \neq \theta 6$.

Figure 20:
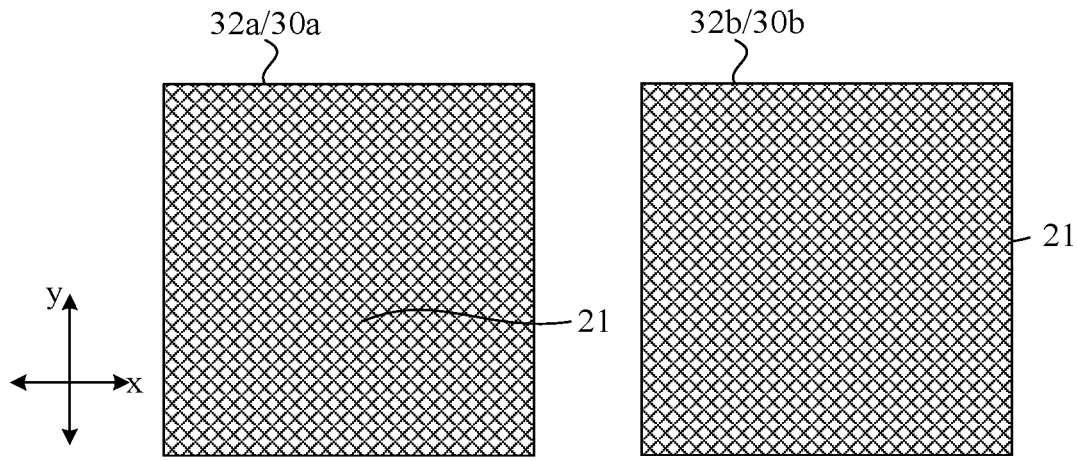
FIG. 20 is a top view of a part of a display panel according to an embodiment of the present disclosure.

FIG. 20 is a top view of a part of a display panel according to an embodiment of the present disclosure. In an embodiment shown in FIG. 20, a plurality of light-emitting elements includes a first light-emitting element 30a and a second light-emitting element 30b that are adjacent to each other, the first light-emitting element 30a includes a first light-emitting layer 32a, and the second light-emitting element 30b includes a second light-emitting layer 32b. A shape of a first overlapping portion 21 overlapping the first light-emitting layer 32a is the same as a shape of a second overlapping portion 21 overlapping the second light-emitting layer 32b. FIG. 20 merely illustrates that one light-emitting layer overlaps one overlapping portion. This embodiment is also applicable to an embodiment in which one light-emitting layer overlaps two or more overlapping portions. In this embodiment, the shapes of the overlapping portions overlapping the light-emitting layer are configured to realize that at least part of the scattered light emitted by the light-emitting layer is not parallel to the pixel column direction and the pixel row direction, thereby reducing the probability of the scattered light emitted by the light-emitting element being caught by the user's eyes and weakening influence of the scattered light of the light-emitting element on the display effect. Meanwhile, a scattering regularity of the scattered light emitted by the first light-emitting layer is substantially the same as a scattering regularity of the scattered light emitted by the second light-emitting layer, which is beneficial to achieve uniformity of the light emission regularity of the light emitting elements during display of the display panel, so as to ensure the overall display uniformity of the display panel.

Figure 21:
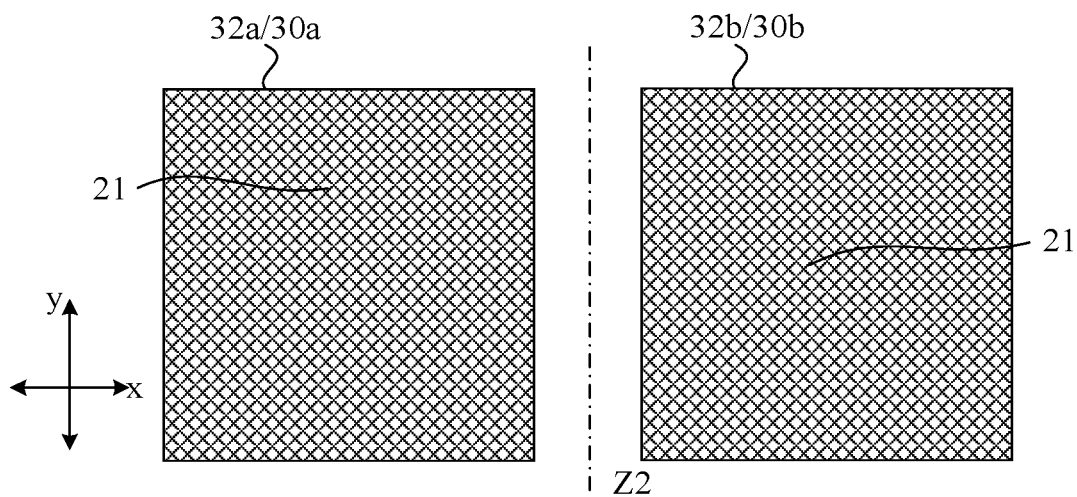
FIG. 21 is a top view of a part of a display panel according to an embodiment of the present disclosure.

FIG. 21 is a top view of a part of a display panel according to an embodiment of the present disclosure. As shown in FIG. 21, the overlapping portion has a curve shape, and the first overlapping portion 21 overlapping the first light-emitting layer 32a and the second overlapping portion 21 overlapping the second light-emitting layer 32b are symmetrical about a second axis of symmetry Z2, and the second axis of symmetry Z2 is parallel to the pixel column direction y. In this way, scattering regularities of the scattered light emitted by the light-emitting elements on both sides of the second axis of symmetry is substantially the same, which is beneficial to achieve the uniform light-emitting regularity of the light-emitting elements in a portion of the display region of the display panel. FIG. 21 only exemplarily illustrates that one light-emitting layer overlaps one overlapping portion, and this embodiment is also applicable to an embodiment in which one light-emitting layer overlaps two or more overlapping portions.

Figure 22:
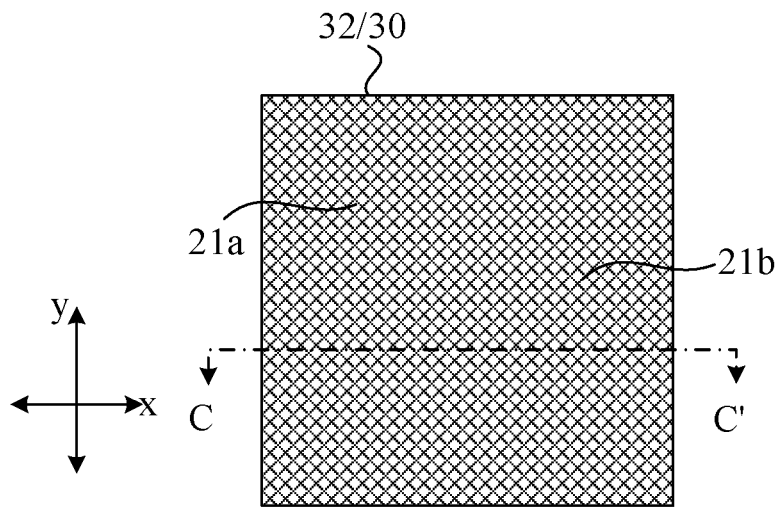
FIG. 22 is a top view of a part of a display panel according to an embodiment of the present disclosure.
Figure 23:
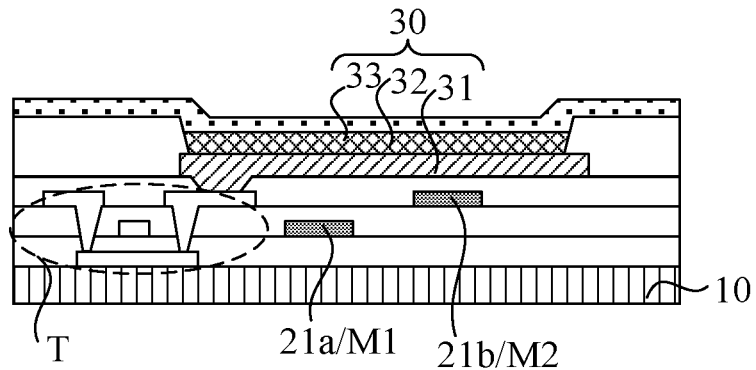
FIG. 23 is a schematic sectional view along line C-C' shown in FIG. 22.

In one embodiment, a first overlapping portion and a second overlapping portion that overlap the same light-emitting layer are located in different layers of the display panel. FIG. 22 is a top view of a part of a display panel according to an embodiment of the present disclosure, and FIG. 23 is a sectional view along tangent line C-C' shown in FIG. 22. As shown in FIG. 22, in the direction perpendicular to the display panel, the overlapping portions 21 overlapping the light-emitting layer 32 include a first overlapping portion 21a and a second overlapping portion 21b. The first overlapping portion 21a and the second overlapping portion 21b do not overlap with each other in the direction perpendicular to the display panel.

In an embodiment shown in FIG. 22, the display panel further includes a first metal layer M1 and a second metal layer M2 that are located on the substrate 10. The first overlapping portion 21a is located in the first metal layer M1, and the second overlapping portion 21b is located in the second metal layer M2. In this embodiment, the first overlapping portion and the second overlapping portion that are located in different metal layers do not overlap with each other, so that the unevenness of the light-emitting layer caused by the thickness of the first overlapping portion and the thickness of the second overlapping portion in the direction perpendicular to the display panel will not be too large, that is, the unevenness of the light-emitting layer can be weakened to a certain degree. Meanwhile, the number of the undulation positions of the light-emitting layers can be increased, and thus the scattering directions of the light scattered by the light-emitting layer can be increased, so that the scattered light is more uniform, thereby weakening the influence of the scattered light of the light-emitting element on the display effect.

In another embodiment, in the direction perpendicular to the display panel, the first overlapping portion and the second overlapping portion that are located in different metal layers partially overlap with each other, which is not shown in figures. This embodiment can also avoid excessively large uneven undulations of the light-emitting layer caused by the thickness of the first overlapping portion and the thickness of the second overlapping portion in the direction perpendicular to the display panel to a certain degree.

FIG. 22 illustrates that one light-emitting layer overlaps two overlapping portions. In another embodiment, one light-emitting layer overlaps an odd number of overlapping portions greater than or equal to 3, and the overlapping portions 21 overlapping the light-emitting layer 32 includes the first overlapping portion 21a and the second overlapping portion 21b described above.

FIG. 23 also illustrates a transistor T of a pixel circuit of the display panel, a first electrode 31 of the light-emitting element 30 is connected to a drain electrode (not labeled) of the transistor T. The transistor T includes an active layer, a gate electrode, a source electrode, and the drain electrode. The display panel includes at least a gate metal layer and a source-drain metal layer that are located above the substrate 10, in which the gate electrode is located in the gate metal layer and the source electrode and the drain electrode are located in the source-drain metal layer. FIG. 23 merely illustrate that the gate metal layer is the first metal layer M1 and the source-drain metal layer is the second metal layer M2. That is, the first overlapping portion 21a and the gate electrode are located in the same layer, and the second overlapping portion 21b, the source electrode and the drain electrode are located in the same layer.

Figure 24:
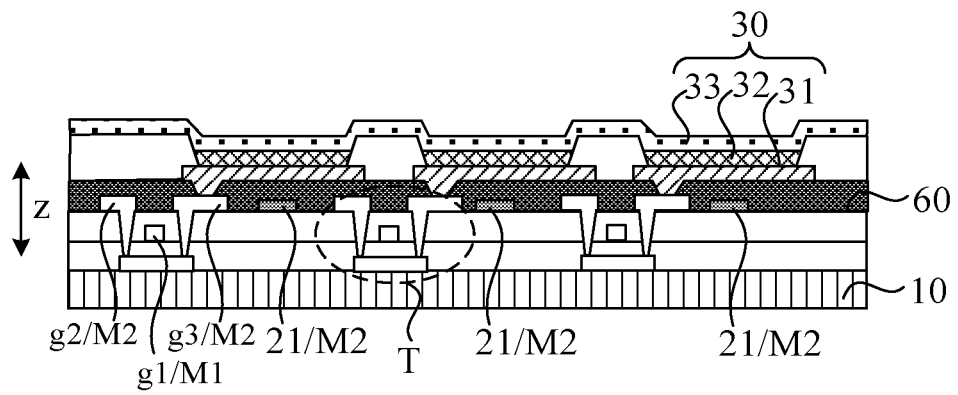
FIG. 24 is a simplified schematic sectional view along line B-B' shown in FIG. 3.

FIG. 24 is a simplified schematic diagram of a cross section along tangent line B-B' shown in FIG. 3. In an embodiment shown in FIG. 24, the display panel further includes a first metal layer M1 and a second metal layer M2 that are located above the substrate 10, a thickness of the second metal layer M2 is greater than a thickness of the first metal layer M1, and the overlapping portion 21 is located in the second metal layer M2. The display panel can further include a planarization layer 60 located between the overlapping portion 21 and the light-emitting element 30. In the process of manufacturing the display panel, the planarization layer 60 is manufactured after the process of the overlapping portion 21, and then the light-emitting element 30 is formed on the planarization layer 60. The planarization layer 60 can provide a relatively flat surface to ensure the flatness of the light-emitting layer 32 of the light-emitting element 30. However, since the overlapping portion 21 has a large thickness and the manufacturing process is limited to coat the planarization layer 60 with a limited coating thickness, undulation of the planarization layer 60 formed on the overlapping portion 21 will still be formed at the position corresponding to the overlapping portion 21, and the light-emitting layer 32 overlapping the overlapping portion 21 is not flat. The overlapping portion 21 in the embodiments of the present disclosure is configured in a manner that at least part of the scattering directions of the scattered light emitted by the light-emitting layer 32 cannot be parallel to the pixel column direction and the pixel row direction, which avoids the scattered light being concentrated in the left and right directions when the user watches the display panel in the front view. This reduces the probability that the scattered light emitted by the light-emitting element is caught by the user's eyes, thereby weakening influence of the scattered light of the light-emitting element on the display effect and improving the display quality.

FIG. 24 also illustrates a transistor T of the display panel. The transistor T includes a gate electrode g1, a source electrode g2, and a drain electrode g3. The first electrode 31 of the light-emitting element 30 is connected to the drain electrode g3. The overlapping portion 21 is located in the same layer as the source electrode g2 and the drain electrode g3. In an embodiment, the second metal layer is made of a material selected from one of titanium, aluminum and titanium, and the first metal layer is made of molybdenum.

In an embodiment, the display panel further includes a transistor structure located on the substrate, and the overlapping portion is located between the transistor structure and the light-emitting element, which will not be shown in figures.

Figure 25:
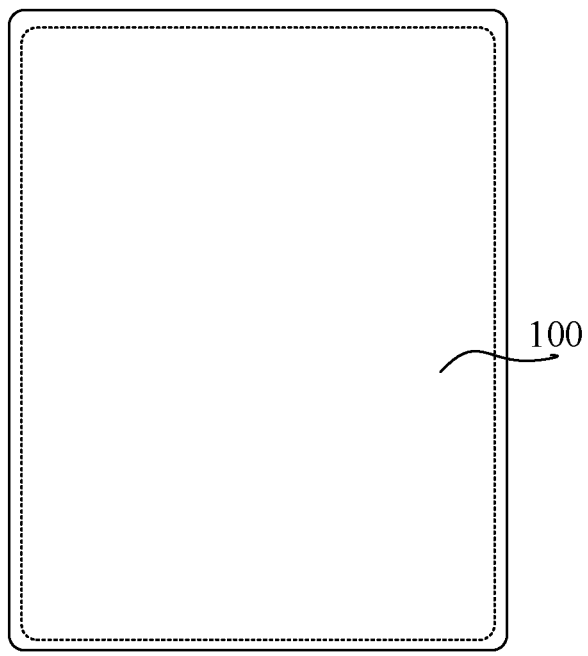
FIG. 25 is a schematic diagram of a display device according to an embodiment of the present disclosure.

An embodiment of the present disclosure also provides a display device. FIG. 25 is a schematic diagram of a display device according to an embodiment of the present disclosure. As shown in FIG. 25, the display device includes the display panel 100 according to any one of embodiments of the present disclosure. The display device in the embodiment of the present disclosure can be any device having a display function, such as a mobile phone, a tablet computer, a notebook computer, an electronic paper book, a television, and a smart wearable product.

The above description are only some embodiments of the present disclosure and are not intended to limit the present disclosure. Any modification, equivalent replacement, improvement, etc. made within the spirit and principle of the present disclosure shall be included in the scope of the present disclosure.

Finally, it should be noted that the above embodiments are only used to illustrate the technical solutions of the present disclosure, but not to limit them. Although the present disclosure has been described in detail with reference to the foregoing embodiments, those skilled in the art can understand that the technical solutions described in the foregoing embodiments can be modified, or some or all of the technical features thereof can be equivalently replaced, and these modifications or replacements within the essence of the corresponding technical solutions fall into the scope of the technical solutions of the embodiments of the present disclosure.

What is claimed is:

1. A display panel, comprising:
   a substrate;
   a plurality of signal lines located on the substrate; and
   a plurality of light-emitting elements, at least one of the plurality of light-emitting elements being located on a side of one of the plurality of signal lines facing away from the substrate,
   wherein at least one of the plurality of light-emitting elements comprises a first electrode, a light-emitting layer and a second electrode that are stacked in sequence,
   wherein in a direction perpendicular to the display panel, at least one of the plurality of signal lines comprises at least one overlapping portion that overlaps the light-emitting layer of one of the plurality of light-emitting elements, and
   wherein an angle θ is formed between an extending direction of a part of the at least one overlapping portion and a pixel column direction in a display region of the display panel that satisfies: 0°<θ<90°, or an angle θ is formed between an extending direction of a tangent of a part of the at least one overlapping portion and a pixel column direction of a display region of the display panel that satisfies: 0°<θ<90°.

2. The display panel according to claim 1, wherein at least one of the at least one overlapping portion has a linear shape.

3. The display panel according to claim 1, wherein at least one of the at least one overlapping portion has a polyline shape that comprises at least two line segments.

4. The display panel according to claim 1, wherein the angel θ satisfies: 45°≤θ<90°.

5. The display panel according to claim 1, wherein at least one of the at least one overlapping portion has a curve shape.

6. The display panel according to claim 5, wherein the curve shape is one of a C-curve shape, an S-curve shape, or a combined curve shape of at least two curve shapes.

7. The display panel according to claim 6, wherein when the curve shape is the C-curve shape, the C-curve shape has a curvature of K, and the light-emitting layer has a length of a μm in the pixel column direction, where $1\times10^4$ m$^{-1}$≤K≤ $(2/a)\times10^6$ m$^{-1}$.

8. The display panel according to claim 1, wherein in a plane of the substrate, along an extending direction of one of the at least one overlapping portion, an orthographic projection of the overlapping portion on the substrate has at least a first width and a second width that is not equal to the first width.

9. The display panel according to claim 1, wherein in the direction perpendicular to the display panel, the light-emitting layer overlaps an odd number of overlapping portions of the at least one overlapping portion, and at least one of the odd number of overlapping portions overlaps a center of the light-emitting layer.

10. The display panel according to claim 1, wherein the at least one overlapping portion comprises at least two overlapping portions; and
in the direction perpendicular to the display panel, the light-emitting layer overlaps an even number of overlapping portions of the at least two overlapping portions.

11. The display panel according to claim 10, wherein in the direction perpendicular to the display panel, none of the even number of overlapping portions overlaps a center of the light-emitting layer.

12. The display panel according to claim 11, wherein orthographic projections of the even number of overlapping portions on the substrate are respectively located on both sides of a center of an orthographic projection of the light-emitting layer on the substrate.

13. The display panel according to claim 12, wherein the orthographic projections of the even number of overlapping portions on the substrate are axisymmetric with respect to a first axis of symmetry, an extending direction of the first axis of symmetry is parallel to the pixel column direction or an extending direction of the first axis of symmetry and the pixel column direction form an acute angle, and the center of the orthographic projection of the light-emitting layer on the substrate is located on the first axis of symmetry.

14. The display panel according to claim 1, wherein the at least one overlapping portion comprises N overlapping portions, where N≥2 and N is an integer;
in the direction perpendicular to the display panel, the light-emitting layer overlaps the N overlapping portions; and
shapes of the N overlapping portions are different from each other.

15. The display panel according to claim 1, wherein the plurality of light-emitting elements comprises a first light-emitting element and a second light-emitting element that are adjacent to each other, the light-emitting layer of the first light-emitting element is a first light-emitting layer, and the light-emitting layer of the second light-emitting element is a second light-emitting layer; and
a first overlapping portion of one of the plurality of signal lines overlaps the first light-emitting layer and has a first shape, and a second overlapping portion of another one of the plurality of signal lines overlaps the second light-emitting layer and has a second shape different from the first shape.

16. The display panel according to claim 1, wherein the plurality of light-emitting elements comprises a first light-emitting element and a second light-emitting element that are adjacent to each other, the light-emitting layer of the first light-emitting element is a first light-emitting layer, and the light-emitting layer of the second light-emitting element is a second light-emitting layer; and
a first overlapping portion of one of the plurality of signal lines overlaps the first light-emitting layer and has a first shape, and a second overlapping portion of another one of the plurality of signal lines overlaps the second light-emitting layer and has a second shape that is the same as the first shape.

17. The display panel according to claim 16, wherein the first overlapping portion and the second overlapping portion are symmetrical with respect to a second axis of symmetry, and the second axis of symmetry is parallel to the pixel column direction.

18. The display panel according to claim 1, further comprising:
a first metal layer and a second metal layer that are located above the substrate,
wherein in the direction perpendicular to the display panel, the at least one overlapping portion comprises a first overlapping portion located in the first metal layer and a second overlapping portion located in the second metal layer, and
wherein at least a part of the first overlapping portion is not overlapped with the second overlapping portion in the direction perpendicular to the display panel.

19. The display panel according to claim 1, further comprising:
a first metal layer and a second metal layer that are located above the substrate,
wherein the second metal layer has a thickness greater than a thickness of the first metal layer, and the at least one overlapping portion is located in the second metal layer.

20. A display device comprising a display panel, wherein the display panel comprises:
a substrate;
a plurality of signal lines located on the substrate; and
a plurality of light-emitting elements, at least one of the plurality of light-emitting elements being located on a side of one of the plurality of signal lines facing away from the substrate,
wherein at least one of the plurality of light-emitting elements comprises a first electrode, a light-emitting layer and a second electrode that are stacked in sequence,
wherein in a direction perpendicular to the display panel, at least one of the plurality of signal lines comprises at least one overlapping portion that overlaps the light-emitting layer of one of the plurality of light-emitting elements, and
wherein an angle θ is formed between an extending direction of a part of the at least one overlapping portion and a pixel column direction in a display region of the display panel that satisfies: 0°<θ<90°, or an angle θ is formed between an extending direction of a tangent of a part of the at least one overlapping portion and a pixel column direction of a display region of the display panel that satisfies: $0°<\theta<90°$.

* * * * *